United States Patent [19]

Sakurai

[11] Patent Number: 4,555,778
[45] Date of Patent: Nov. 26, 1985

[54] SEMICONDUCTOR MEMORY DEVICE
[75] Inventor: Takayasu Sakurai, Tokyo, Japan
[73] Assignee: Kabushiki Kaisha Toshiba, Japan
[21] Appl. No.: 636,220
[22] Filed: Jul. 31, 1984
[30] Foreign Application Priority Data
Aug. 31, 1983 [JP] Japan .................................. 58-159313
[51] Int. Cl.⁴ .............................................. G11C 8/00
[52] U.S. Cl. ...................................... 365/230; 365/72
[58] Field of Search .................... 365/189, 230, 63, 69, 365/72

[56] References Cited
U.S. PATENT DOCUMENTS
4,368,523 1/1983 Kawate .................................. 365/63

OTHER PUBLICATIONS
Yoshimoto, et al., "A 64Kb Full CMOS RAM with Divided Word Line Structure", IEEE International Solid-State Circuits Conference, ISSCC, pp. 58-59, Feb. 23, 1983.
Watanabe, et al., "A Battery Backup 64K CMOS RAM with Double Level Aluminum Technology" IEEE International Solid-State Circuits Conference, ISSCC, pp. 60-61, Feb. 23, 1983.

Primary Examiner—James W. Moffitt
Attorney, Agent, or Firm—Finnegan, Henderson, Farabow, Garrett & Dunner

[57] ABSTRACT

Disclosed is a semiconductor memory device in which a group of memory cells consists of a plurality of memory sections, each memory section is provided with a first data line, and a second data line is provided for connecting together the first data lines.

6 Claims, 25 Drawing Figures

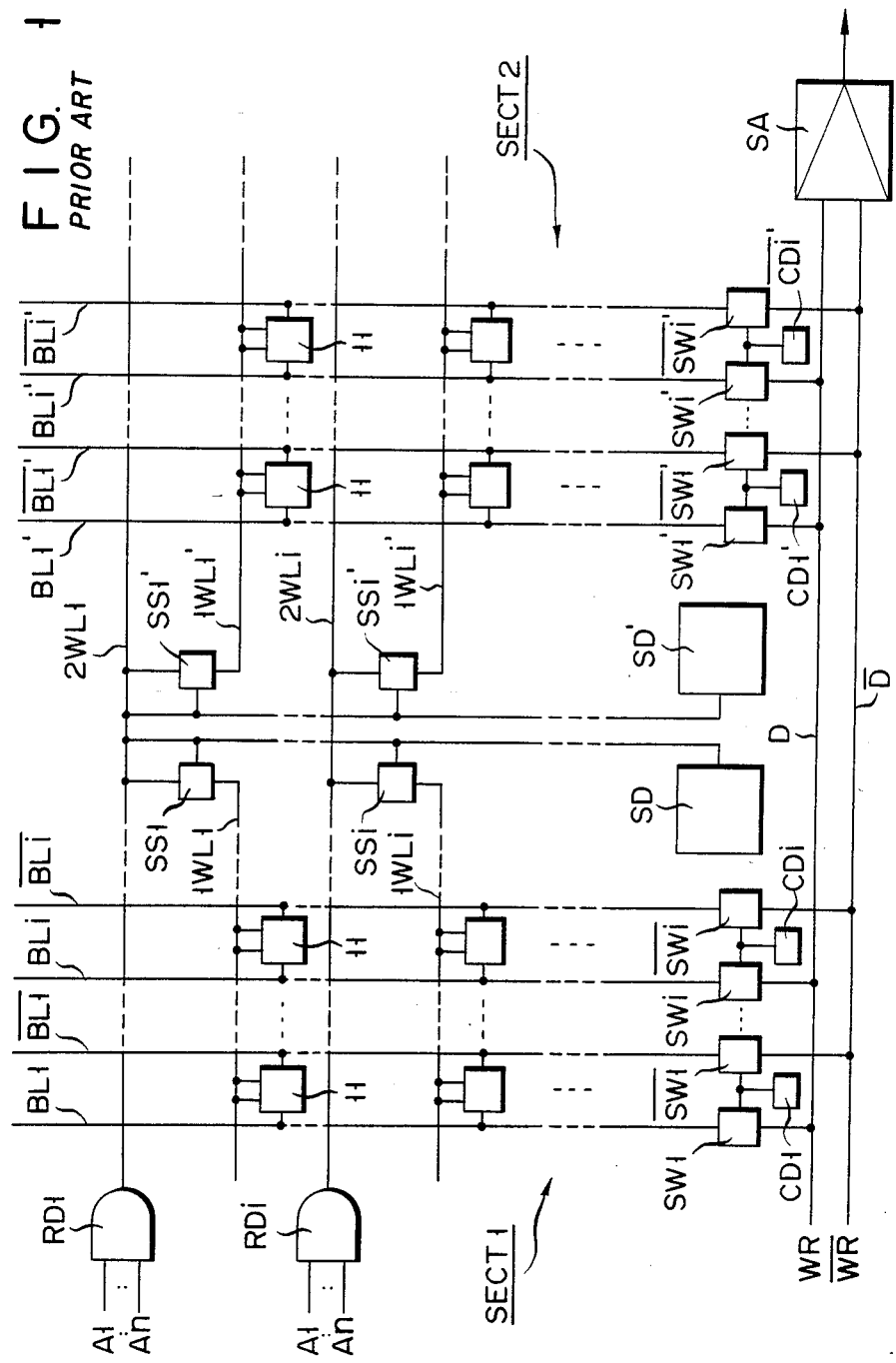

F I G. 6A    F I G. 6B
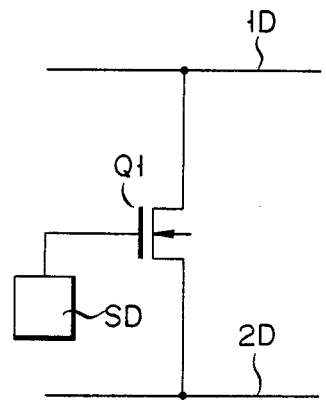
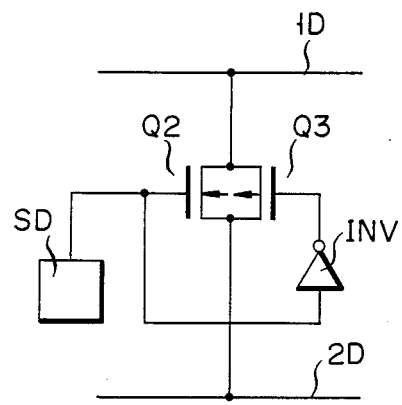
F I G. 7A
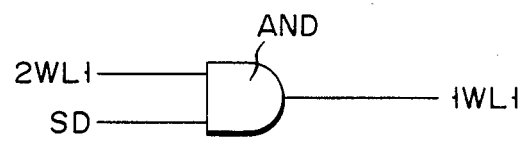
F I G. 7B
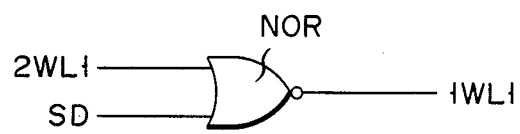

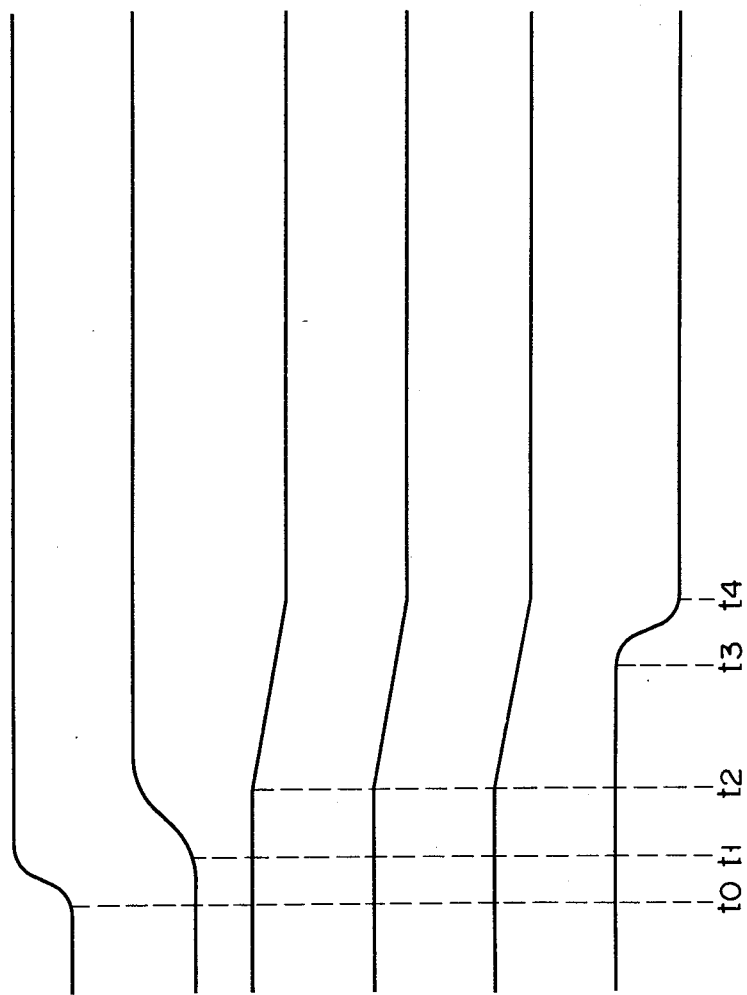

F I G. 9
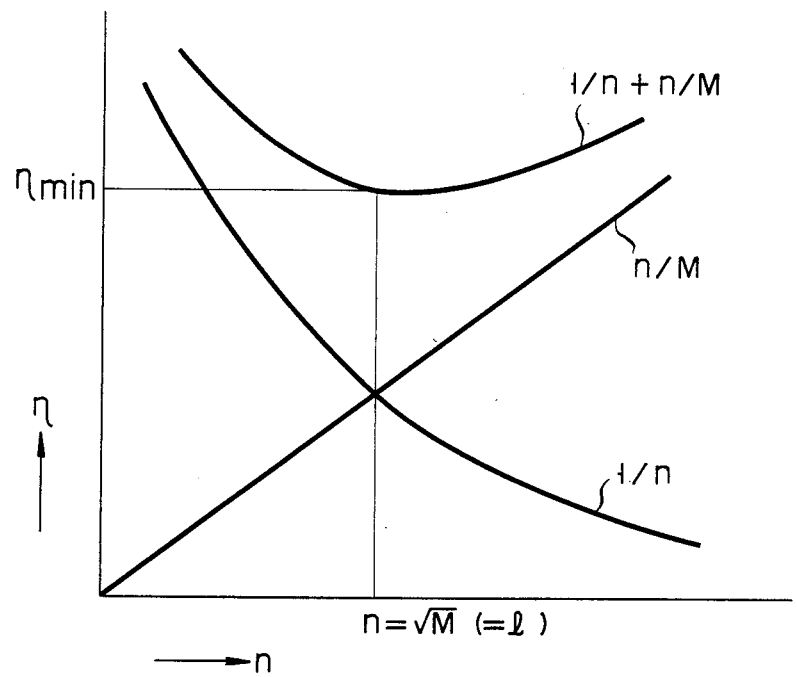

F I G. 10A
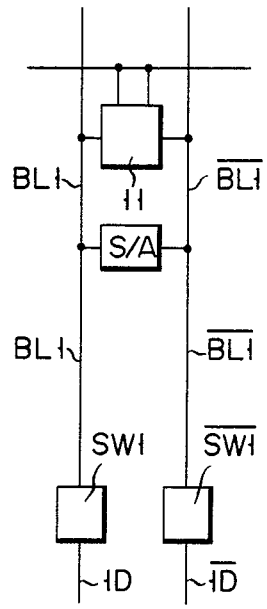
F I G. 10B
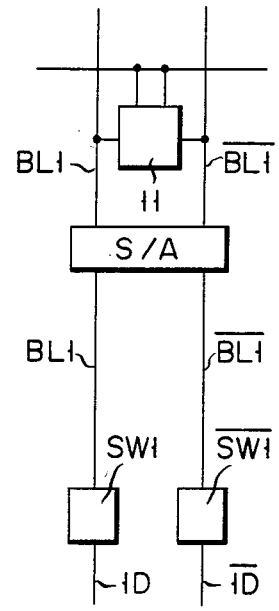
F I G. 11A
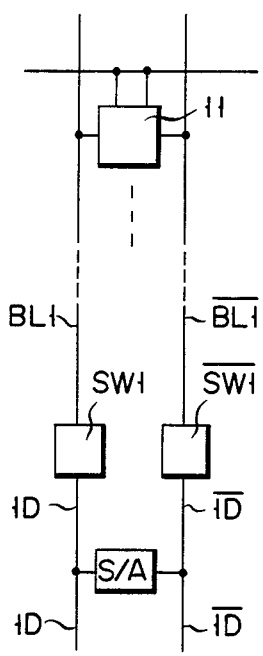
F I G. 11B
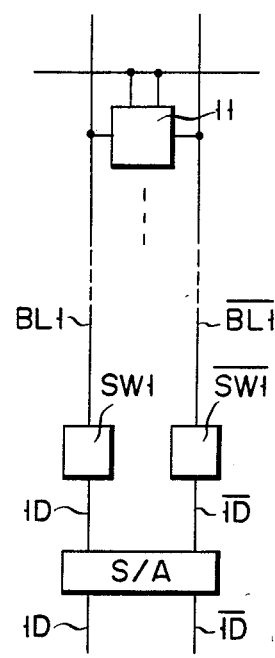

SEMICONDUCTOR MEMORY DEVICE

BACKGROUND OF THE INVENTION

The present invention relates to a semiconductor memory device operable at a high speed.

With remarkable progress in recent semiconductor technology, a higher operating speed is required for the semiconductor memory device. An example of the prior memory device operating at a high speed is disclosed in Japanese Patent Application No. 57-138573, filed by the same applicant as that of the present invention. In the semiconductor memory device, a delay in the access time on the word line is reduced for speeding up the memory device operation. FIG. 1 shows an arrangement of such a memory device. In the figure, reference numerals 11, 11, . . . designate memory cells, respectively; SECT1 and SECT2 designate the first and second memory sections; 1WLi and 1WLi' designate the "i"th word lines in the memory sections SECT1 and SECT2; 2WLi designates the second word line in the "i"th line; RDi designates a row decoder of the "i"th line; BL1, BL1 to BLi, $\overline{BLi}$ and BL1', BL1' to BL1', BLi' designate bit lines; SSi and SSi' designate select switches for selecting the first word lines 1WLi and 1WLi' in the "i"th line in the memory sections SECT1 and SECT2, respectively; SD and SD' designate section decoders for controlling select switches SSi and SSi': SW1, SW1 to SWi, SWi and SW1', SW1' to SWi', SWi' designate switches for selecting bit lines controlled by the output of the column decoders CD1, . . . CDi and CDi', . . . CDi', D and $\overline{D}$ designate data lines; SA designates a sense amplifier; WR and $\overline{WR}$ designate write signals; and OUT designates an output signal.

In the semiconductor device thus arranged, in an access mode, the activated memory cells are only those connected to one of the first word lines 1WL1, . . . 1WLi, . . . , or one of the word lines 1WL', . . . 1WLi', . . . as defined by the row decoders RD1, . . . , RDi, . . . and the section decoder SD (or SD'). The remaining memory cells are not activated. This implies that the number of memory cells to be driven by a one row decoder may be reduced, and that an access time on the word line can be reduced. In fact, this semiconductor memory device is operable at a speed two to three times that of the conventional memory device.

FIGS. 2A and 2B respectively illustrate circuit arrangements of the switch SW1. The circuit arrangements of the other switches SW1–SWi, SWi–SW1, SW1' to SWi', SWi' are each the same as that of the switch SW1 with the exception of the bit lines. The switch in FIG. 2A comprises a MOSFET (metal oxide semiconductor field effect transistor) Q1 of an N channel type inserted between the bit line BLi and the data line D. The MOSFET Q1 is controlled by the output signal from the column decoder CD1. The switch in FIG. 2B comprises a transmission gate containing a couple of MOSFETs Q2 and Q3 of the N and P channel type. If necessary, a column sense amplifier may be connected between a bit line and its complementary bit line, for example, the bit lines BL1 and BL1.

FIG. 3 shows a circuit arrangement of one of the memory cells 11 in the memory device shown in FIG. 1. In FIG. 3, Q4 and Q5 designate MOSFETs as gate elements. MOSFET pairs Q6, Q7 and Q8, Q9 respectively form CMOS (complementary MOS) inverters 12 and 13. The inverters 12 and 13 are interconnected at the input terminals, thereby forming a latch circuit. The output terminal of the inverter 12 and the input terminal of the inverter 13 are connected to one end of the MOSFET Q4. The output terminal of the inverter 13 and the input terminal of the inverter 12 are connected to one end of the MOSFET Q5.

In the circuit arrangement of FIG. 1, the data lines D and $\overline{D}$ are respectively connected to ends of the switches SW1, SWi, SW1', SWi', and SW1, SWi, SW1', SWi'. With this connection, the data lines D and e,ovs/D/ are accompanied by a stray capacitance present between the substrate and the source, the substrate and the drain, or the substrate and the gate of each of the MOSFETs forming the switches, even if those switches are not in an ON state. This indicates a great stray capacitance of the data lines D and $\overline{D}$, and provides a great delay in the signal on the data line.

The signal delay will be discussed referring to FIGS. 4A–4E.

Let it be assumed that at time $t_o$, the second word line 2WLi is selected by the row decoder RDi. The potential on the second word line 2WLi rises at a high speed (FIG. 4A). Following this, the first word line 1WLi of the memory section SECT1 (or the first word line 1WLi' in the second memory section SECT2) also rises at a high speed (at time t1 in FIG. 4B). The potential on the bit line BLi ($\overline{BLi}$) gently varies (FIG. 4C). The gentle variation of the potential arises from the fact that the switches SW1, SW1 to SWi, $\overline{SWi}$ or SW1', SW1' to SWi', SWi' are structured as shown in FIG. 2A or FIG. 2B, and when these switches are selected, the bit lines BLi and $\overline{BLi}$ are respectively connected to the data lines D and $\overline{D}$, thereby increasing the stray capacitance associated therewith. The increased stray capacitance provides a gentle variation of the potential on the data lines D and $\overline{D}$ (FIG. 4D). It is for this reason that a potential level of the output signal OUT of the sense amplifier SA settles down at time t2 after a very long time elapses from the time t1 (FIG. 4E). If a switch containing the section sense and write amplifiers is used for the switches SW1, SW1 to SWi, $\overline{SWi}$ and SW1', SW1' to SWi', SWi', the bit lines BLi and $\overline{BLi}$ and the data lines D and $\overline{D}$ may be electrically separated from each other. Therefore, the potential change on the bit line BLi is relatively quicker as indicated by a broken line (FIG. 4C). The capacitance strayed in association with the data lines D and $\overline{D}$ is great, however. In this respect, the improvement of the operation speed of the memory device is still unsatisfactory.

SUMMARY OF THE INVENTION

Accordingly, an object of the present invention is to provide a semiconductor memory device which reduces the signal delay on the data lines, and hence attains a high speed operation of the memory device.

According to the invention, there is provided a semiconductor memory device comprising:

a group of memory cells comprising of a plurality of memory sections;

a plurality of first word lines provided corresponding to said memory sections;

a plurality of bit lines provided crossing said first word lines;

a plurality of second word lines provided commonly for said memory sections and corresponding to said word lines;

a plurality of section switches respectively provided between said first and second word lines, said section switches selecting one of said memory sections according to the output of a section decoder;

first data lines provided corresponding to said bit lines;

a plurality of switches controlled by the output of a column decoder provided between said bit lines and said first data lines;

a pair of second data lines provided commonly for said memory sections and corresponding to said first data line; and data line section switches provided between said first data lines and the pair of said second data lines in each of said memory sections, said data line section switches being controlled by the output of said section decoder.

BRIEF DESCRIPTION OF THE DRAWINGS

FIG. 1 schematically illustrates a conventional semiconductor memory device;

FIGS. 6A and 6B are circuit arrangements of a data line select switch DSS assembled into the memory device shown in FIG. 5;

FIGS. 7A and 7B show arrangements of a switch SS1 used in the memory device of FIG. 5;

FIGS. 8A to 8F show timing charts illustrating a sequence of operations of the memory device shown in FIG. 5;

FIG. 9 shows a graphical representation useful in explaining the best effect attained by the present invention; and FIGS. 10A and 10B and FIGS. 11A and 11B show modifications of a part of the memory device according to the present invention.

DETAILED DESCRIPTION OF THE PREFERRED EMBODIMENTS

Figure 2A:
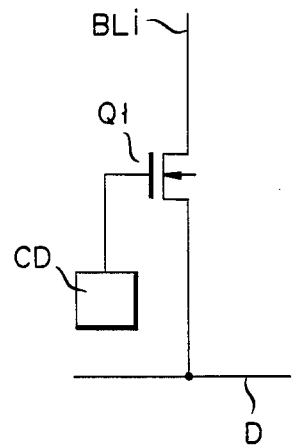
FIGS. 2A and 2B show circuit arrangements of a switch SW1 assembled into the memory device of FIG. 1.
Figure 2B:
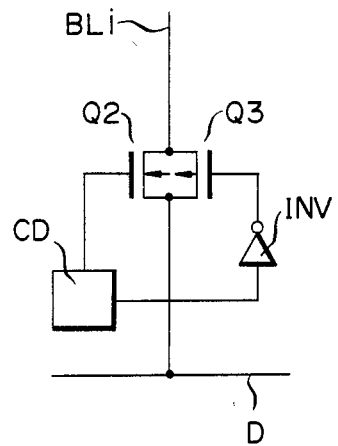
Figure 3:
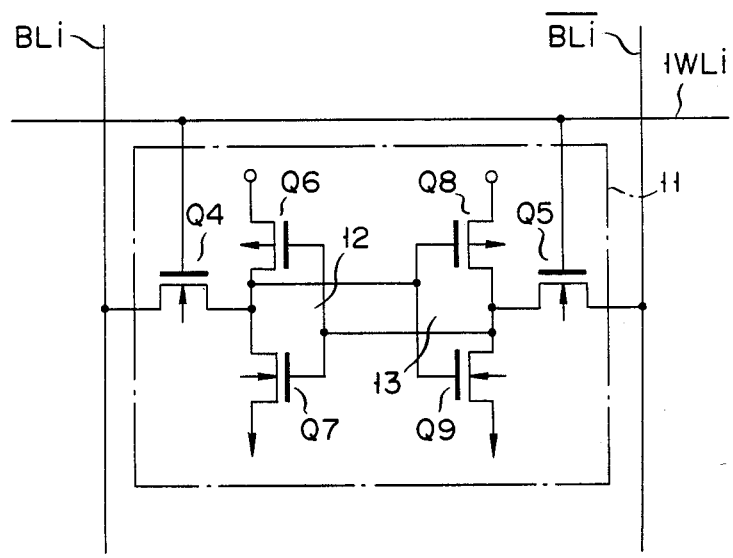
FIG. 3 is a circuit diagram illustrating a memory cell used in the memory device of FIG. 1.
Figure 4:
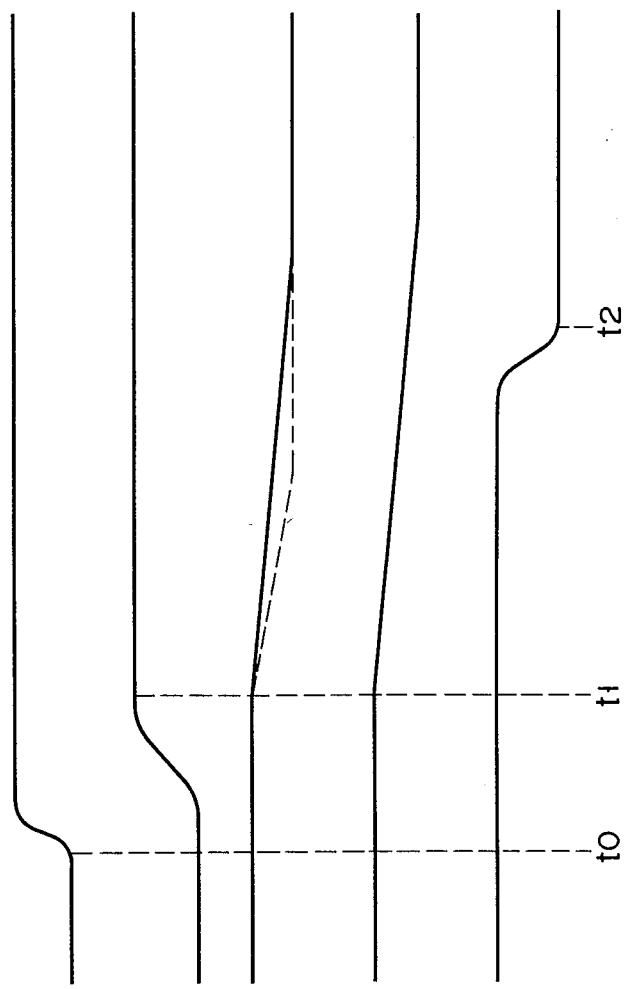
FIGS. 4A-4E show waveforms of signals at key portions in the semiconductor memory device of FIG. 1.
Figure 5:
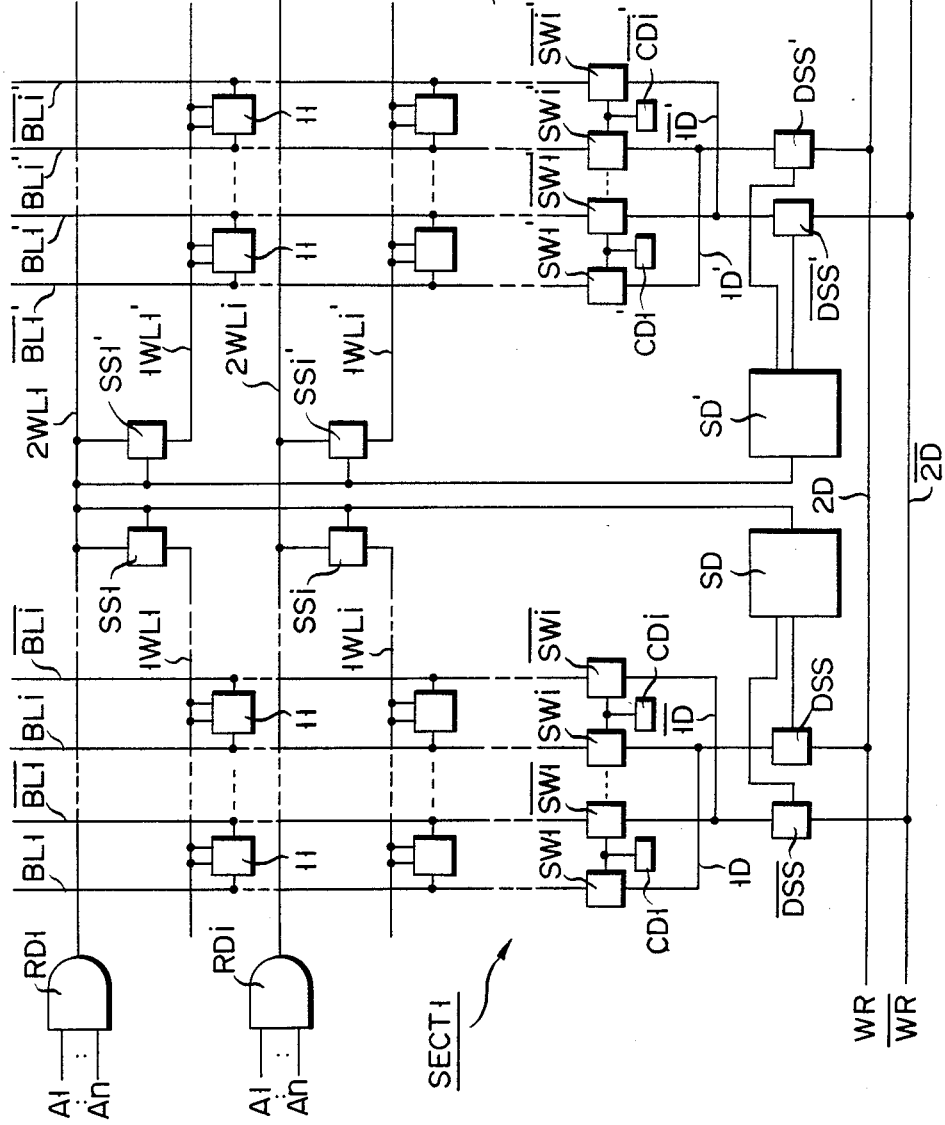
FIG. 5 schematically illustrates a circuit arrangement of a semiconductor memory device which is an embodiment of the present invention.

Reference is first made to FIG. 5 illustrating an embodiment of a semiconductor memory device according to the present invention. In FIG. 5, like reference symbols are used for designating like or equivalent portions in FIG. 1. As recalled, the prior art example of FIG. 1 has two individual memory sections each containing a number of memory cells. Also in the present embodiment, a group of memory cells 11 is divided into two sections: SECT1 and SECT2. The memory cells are located at intersections of bit lines BL1, BL1, ..., BLi, $\overline{BLi}$, ..., and the first word lines 1WL1, ..., 1WLi, ..., and at the intersections of bit lines BL1', BL1', ..., BLi', BLi', ..., and the first word lines 1WL1', ..., 1WLi', .... The first word lines 1WL1, ..., 1WLi, ... are respectively connected through section switches SS1, ..., SSi, ... to the second word lines 2WL1, ..., 2WLi, .... The first word lines 1WL1', ..., 1WLi', ... are respectively connected through the section switches SS1', ..., SSi', ..., to the second word lines 2WL1, ..., 2WLi, .... The section switches SS1, ..., SSi, ... and SS1', ... SSi', ... are under control by section decoders SD and SD', respectively. The second word lines 2WL1, ..., 2WLi, ... are respectively connected to the row decoder RD1, ..., RDi, ..., and are respectively supplied with the output signals from the latter. A group of address signals A1-An are supplied to each of the row decoders RD1, ..., RDi, .... The bit lines BL1, ..., BLi, ... are connected to one ends of the switches SW1, ..., SWi, ..., respectively. Similarly, the bit lines $\overline{BL1}$, ..., $\overline{BLi}$, ... are respectively connected to one ends of the switches $\overline{SW1}$, ..., $\overline{SWi}$, .... The bit lines BL1', ..., BLi', ... are respectively connected to one ends of the switches SW1', ..., SWi', .... The bit lines $\overline{BL1'}$, ..., $\overline{BLi'}$, ... are respectively connected to one ends of the switches $\overline{SW1'}$, ..., $\overline{SWi'}$, .... The other ends of the switches SW1, ..., SWi, ... are connected to the first data line 1D. The other end of the switches $\overline{SW1}$, ..., $\overline{SWi}$, ... are connected to the first data line $\overline{1D}$. The other ends of the switches SW1', ..., SWi', ... are connected to the first data line 1D'. The other ends of the switches $\overline{SW1'}$, ..., $\overline{SWi'}$, ... are connected to the first data line $\overline{1D'}$. The switches SW1, $\overline{SW1}$, ..., SWi, $\overline{SWi}$, ... are connected to and controlled by the column decoders CD1, ..., CDi, .... The switches SW1', $\overline{SW1'}$, ..., SWi', $\overline{SWi'}$, ... are connected to and controlled by the column decoders CDi', ..., CDi'.... The first data line 1D is connected to the second data line 2D through a data line select switch DSS controlled by the section decoder SD. The first data line $\overline{1D}$ is connected to the second data line $\overline{2D}$ through a data line section switch $\overline{DSS}$ controlled by a section decoder SD. The first data line 1D' is connected to the second data line 2D via a data line select switch DSS' controlled by a section decoder SD'. Similarly, the first data line $\overline{1D'}$ is connected to the second data line $\overline{2D}$ via a data line select switch $\overline{DSS'}$ controlled by a section decoder SD'. The second data lines 2D and $\overline{2D}$ are supplied at one ends with write signals WR and $\overline{WR}$, respectively. The other ends of the second data lines 2D and $\overline{2D}$ are connected to the sense amplifier SA. The output signal OUT is derived from the sense amplifier SA.

Turning now to FIGS. 6A and 6B, there are shown circuit arrangements of the data line section switch DSS.

In FIG. 6A, the switch comprises an N channel MOSFET Q1 of which the current path is connected between the first data line 1D and the second data line 2D, and the gate is connected to the section decoder SD. The output signal from the section decoder SD gate-controls the MOSFET Q1 to connect and disconnect the first data line 1D to and from the second data line 2D. A P channel MOSFET may be used for the FET Q1. In this case, the output level of the decoder SD when it is conductive is opposite to that of the P channel transistor case.

In the switch shown in FIG. 6B, N- and P-channel MOSFETs Q2 and Q3 are interconnected so as to form a transmission gate. One of the interjunctions of the MOSFETs Q2 and Q3 is connected to the first data line 1D, while the other to the second data line 2D. The gate of the MOSFET Q2 is directly connected to the section decoder SD. The section decoder SD is also connected through the inverter INV to the gate of the MOSFET Q3. When the output of the section decoder SD is logical "1", the gate of the MOSFET Q2 is coupled with the logical "1" as intact. The gate of the MOSFET Q3 is coupled with logical "0" from the inverter INV. In this case, the MOSFETs Q2 and Q3 are both ON, and the first and second data lines 1D and 2D are interconcted. When the output of the section decoder SD is logical "0", the gate of the MOSFET Q2 is coupled with the logical "0" as intact, while the gate of the MOSFET Q3 is coupled with logical "1". In this case, the FETs Q2 and Q3 are both OFF, and the first and second data lines 1D and 2D are disconnected from each other.

The circuit arrangement shown in FIGS. 6A or 6B is applied for the switch DSS. The same circuit arrangement is also applied for the remaining switches $\overline{DSS}$, DSS', $\overline{DSS'}$, except that the first data lines are 1D, 1D', and 1D', and the second data line are 2D, 2D, and 2D, respectively.

FIGS. 7A and 7B show circuit arrangements of the switch SS1.

The switch of FIG. 7A comprises an AND gate connected at one input terminal to the second word line 2WL1, at the other input terminal to the section decoder SD, and at the output to the first word line 1WL1. When the inputs of the AND gate are both logical "1", its output is logical "1" to select the first word line 1WL1. FIG. 7B shows a switch comprising a NOR gate which is connected at one input terminal to the second word line 2WL1, and at the other input terminal to the section decoder SD, and at the output to the first word line 1WL1. When both the inputs are logical "0", its output is logical "1", thereby to select the first word line 1WL1. The remaining switches SS2, ..., SSi, ... have substantially the same arrangements as this arrangement.

The operation of the memory device of FIG. 5 will be described referring to FIGS. 8A to 8F.

A read mode of the memory device will first be given. Let us assume that at time $t_0$ the row decoder RDi is selected by the address signals Al–An, and its output becomes high (H) level. Under this condition, the potential on the second word line 2WLi rises at a high speed (FIG. 8A). Then, by the section decoders SD and SD', the section switches SS1, ..., SSi, ...; SS1', ... SSi', ... are controlled. As a result of the control, the switches SS1, ... SSi, ..., for example, are turned on to select the first word line 1WLi. Alternatively, the switches SS1', ..., SSi', ... are turned on and the first word line 1WLi' is selected. When the first word line 1WLi is selected, the potential on the first word line 1WLi, at time t1, rises with the rising of the potential on the second word line 2WLi (FIG. 8B). When the switches SW1, SW1, ..., SWi, $\overline{SWi}$, ... (or SW1', $\overline{SW1'}$, ..., SWi', $\overline{SWi'}$, ...) are selectively ON and OFF according to the output signals of the column decoders CD1, ..., CDi, ...; CD1', ... CDi', ..., the potential on the bit line BLi and $\overline{BLi}$, for example, change at high speed at time $t_o$ (FIG. 8C) because the sum of the capacitances of the first and second data lines 1D, 1D, 2D and 2D of the bit lines BLi and $\overline{Bli}$ is reduced. In this case, the data line section switches DSS and $\overline{DSS}$ (or DSS' and $\overline{DSS'}$) are caused to be in an ON state by the section decoder SD (or SD'). Therefore, the signal read out from the selected memory cell is transferred through the second data lines 2D and 2D to the sense amplifier SA. At time t3, the sense amplifier SA starts its operation to produce an output signal (FIG. 7F). Note here that the second data lines 2D and 2D are connected to only the data line section switches DSS, $\overline{DSS}$, DSS', $\overline{DSS'}$. This implies that the stray capacitance on the second data lines 2D and 2D is small. With less amount of stray capacitance, the potential on the second data lines 1D, 1D and 2D, 2D quickly changes from time t2 with the level change on the bit lines BLi and $\overline{BLi}$ (FIGS. 7D and 7E). Accordingly, the output signal OUT settles down at time t4 immediately after the setting of the address (FIG. 7F).

A write mode of the memory device will be given.

In this mode, one of the sections of the memory cells is selected by controlling the section switches SSi and SSi' and the data line section switches DSS, $\overline{DSS}$, DSS' and $\overline{DSS'}$ by means of the section decoders SD and SD'. At the same time, the second word line 2WLi is selected by the row decoder RDi. As a result, the first word line 1WLi is selected to activate the memory cells connected to the first word line 1WLi. The column decoders CD1, ..., CDi, ...; CD1', ... CDi', ... control the switches SW1, $\overline{SW1}$, ...; SWi, $\overline{SWi}$, ...; SW1', $\overline{SW1'}$, ..., SWi', $\overline{SWi'}$, to select the bit lines BLi and $\overline{BLi}$. Then, data is written into the memory cell at the intersection of the first selected word line 1WLi and the selected second word line 2WLi.

With such an arrangement, if the memory device is a static RAM of 256 Kilo bits, a junction capacitance of the second data line 2D is 1 pF, and the junction capacitance of the first data line 1D is 2 pF × 32/512 = 0.13 pF. The sum of the capacitances is 1 pF + 2 pF × 16/512 = 0.13 pF. A delay time by the data line is a very short 4 ns.

While in the above embodiment, only two memory sections SECT1 and SECT2 are employed for simplicity of explanation, the number of the sections may properly be selected as required.

Let us obtain a condition to obtain the best effect of the present invention, that is, to minimize the sum of the junction capacitances of the first and second data lines 1D and 2D. Assume that the total number of columns is M, the total number of the sections is l, and the number of columns contained in one section is n. The junction capacitance $C_D$ on the data line D in the conventional memory device shown in FIG. 1 is proportional M; $C_D \propto M$. In the memory device shown in FIG. 5, which is the preferred embodiment of the present invention, the sum of the junction capacitances $C_{1D}$ and $C_{2D}$ on the first and second data lines 1D and 2D is proportional n+l; $C_{1D} + C_{2D} \propto n+l$.

The effect of the present invention is maximized when the following equation is minimized:

$$\eta = \frac{C_{1D} + C_{2D}}{C_D}.$$

Rearranging the above formula, we have:

$$\eta = \frac{n+l}{M} = \frac{n+l}{nl} = \frac{1}{n} + \frac{1}{l}.$$

Since nl = M, the we have:
1/l = n/M.
Hence,
n = 1/n + 1/l = 1/n + n/M.

This is graphically illustrated in FIG. 9 in which the abscissa is represented by $n = \sqrt{M}(=l)$, while the ordinate by $\eta$. The ratios n/M and 1/n changes as indicated by curves A and B, respectively. The sum of those curves is indicated by a curve C. A minimum point of the curve C lies at the intersection of the curves A and B, i.e. a point $n = \sqrt{M} = l$. Thus, when $n = \sqrt{M} = l$, the device most effectively operates. Of course, it effectively operates when $n \approx \sqrt{M} \approx l$.

If necessary, sense amplifiers SA may be respectively provided between the bit line pair BL1 and BL1, as shown in FIGS. 10A and 10B, respectively. Similarly, sense amplifiers SA may be respectively provided between the data line pair 1D and 1D, as shown in FIGS. 11A or 11B. Provision of the sense amplifier improves data sensing accuracy.

As seen from the foregoing description, the junction capacitance on the data lines is reduced to minimize the delay in the access time on the data lines. Therefore, the operation speed of the semiconductor memory device is remarkably improved.

What is claimed is:

1. A semiconductor memory device comprising:
    a group of memory cells comprising of a plurality of memory sections;
    a plurality of first word lines provided corresponding to said memory sections;
    a plurality of bit lines provided crossing said first word lines;
    a plurality of second word lines provided commonly for said memory sections and corresponding to said word lines;
    a plurality of section switches respectively provided between said first and second word lines, said section switches selecting one of said memory sections according to the output of a section decoder;
    first data lines provided corresponding to said bit lines;
    a plurality of switches controlled by the output of a column decoder provided between said bit lines and said first data lines;
    a pair of second data lines provided commonly for said memory sections and corresponding to said first data line; and
    data line section switches provided between said first data lines and the pair of said second data lines in each of said memory sections, said data line section switches being controlled by the output of said section decoder.

2. A semiconductor memory device according to claim 1, in which said data line section switches each comprise a MOSFET which is connected at one end of the current path to the other end of said first data line, and at the control terminal to said section decoder.

3. A semiconductor memory device according to claim 1, in which said data line section switches each comprise a couple of MOSFETs of a different channel type, in which one of the junctions of said transistor pair is connected to said first data line, and the other is connected to said second data line, the gate of one of said transistors is directly connected to said section decoder, and the gate of the other is directly connected to said section decoder through an inverter.

4. A semiconductor memory device according to claim 1, in which a plurality of select switches for selecting one of said memory sections are each comprised of an AND gate which is connected at one of the input terminals to said second word line, at the other to said section decoder, and at the output terminal to said first word line.

5. A semiconductor memory device according to claim 1, in which a plurality of select switches for selecting one of said memory sections are each comprised of a NOR gate which is connected at one of the input terminals to said second word line, at the other to said section decoder, and at the output terminal to said first word line.

6. A semiconductor memory device according to claim 1, in which the total number M of said bit lines, the total number l of said memory sections, and the number "n" of bits contained in one memory section are related by the following relation:

$$n \simeq \sqrt{M} \simeq l.$$

* * * * *